(12) United States Patent
Choi

(10) Patent No.: US 8,803,459 B2
(45) Date of Patent: Aug. 12, 2014

(54) STEERING CONTROL APPARATUS

(75) Inventor: Dae Geun Choi, Pyeongtaek-si (KR)

(73) Assignee: Mando Corporation, Gyeonggi-Do (KR)

( * ) Notice: Subject to any disclaimer, the term of this patent is extended or adjusted under 35 U.S.C. 154(b) by 340 days.

(21) Appl. No.: 13/251,553

(22) Filed: Oct. 3, 2011

(65) Prior Publication Data

US 2012/0081055 A1    Apr. 5, 2012

(30) Foreign Application Priority Data

Oct. 4, 2010  (KR) .................. 10-2010-0096378

(51) Int. Cl.
*H02P 7/00*    (2006.01)

(52) U.S. Cl.
USPC .................... 318/432; 318/293; 318/287

(58) Field of Classification Search
USPC .............. 318/432, 293, 287; 361/720, 690
See application file for complete search history.

(56) References Cited

U.S. PATENT DOCUMENTS

| 5,602,451 A | * | 2/1997 | Kohge et al. .......... 318/293 |
| 2005/0257986 A1 | | 11/2005 | Kagei |
| 2007/0089927 A1 | | 4/2007 | Kim et al. |

FOREIGN PATENT DOCUMENTS

| CN | 2178581 Y | 10/1994 |
| CN | 1956639 A | 5/2007 |
| JP | 2008-174097 A | 7/2008 |
| KR | 10-0646404 B1 | 11/2006 |

OTHER PUBLICATIONS

Chinese Office Action, w/ English translation thereof, issued in Chinese Patent Application No. CN 201110348453.X dated Sep. 23, 2013.

* cited by examiner

*Primary Examiner* — Karen Masih
(74) *Attorney, Agent, or Firm* — McDermott Will & Emery LLP

(57) ABSTRACT

Disclosed is a steering control apparatus having a structure by which it is possible to efficiently dissipate high heat that may be generated, simplify a manufacturing process, and reduce manufacturing costs.

4 Claims, 1 Drawing Sheet

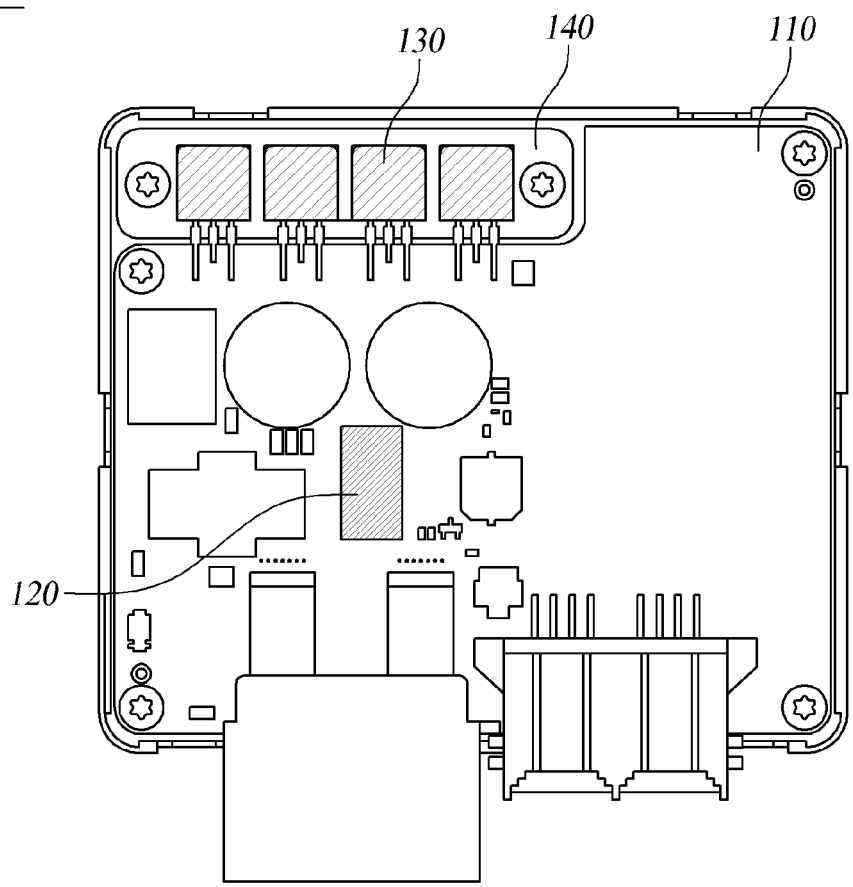

STEERING CONTROL APPARATUS

CROSS-REFERENCE TO RELATED APPLICATION

This application claims priority from and the benefit under 35 U.S.C. §119(a) of Korean Patent Application No. 10-2010-0096378, filed on Oct. 4, 2010, which is hereby incorporated by reference for all purposes as if fully set forth herein.

BACKGROUND OF THE INVENTION

1. Field of the Invention

The present invention relates to a steering control apparatus.

2. Description of the Prior Art

A conventional steering control apparatus has a structure, which generates high heat at the time of applying a high current to the structure, or requires a complicated manufacturing process or high manufacturing costs.

SUMMARY OF THE INVENTION

Accordingly, the present invention has been made to solve the above-mentioned problems occurring in the prior art, and an aspect of the present invention is to provide a steering control apparatus having a structure by which it is possible to efficiently dissipate high heat that may be generated, simplify a manufacturing process, and reduce manufacturing costs.

In accordance with an aspect of the present invention, there is provided a steering control apparatus, which controls and generates a motor command current through a current control based on an input driver's steering torque and a detected motor operation current, to perform a function of assisting the driver's steering torque, the steering control apparatus including: a main printed circuit board in which the function of assisting the driver's steering torque is implemented with an electronic circuit; and a motor operation current detection shunt resistor directly mounted on a surface of the main printed circuit board so as to detect the motor operation current.

Accordingly, as described above, the present invention provides a steering control apparatus having a structure by which it is possible to efficiently dissipate high heat that may be generated, simplify a manufacturing process, and reduce manufacturing costs.

BRIEF DESCRIPTION OF THE DRAWINGS

The above and other objects, features and advantages of the present invention will be more apparent from the following detailed description taken in conjunction with the accompanying drawings, in which:

FIG. 1 is a view illustrating a steering control apparatus according to an embodiment of the present invention.

DETAILED DESCRIPTION OF THE PREFERRED EMBODIMENTS

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if it is described in the specification that one component is "connected," "coupled" or "joined" to another component, a third component may be "connected," "coupled," and "joined" between the first and second components, although the first component may be directly connected, coupled or joined to the second component.

FIG. 1 is a view illustrating a steering control apparatus 100 according to an embodiment of the present invention.

The steering control apparatus 100 according to the embodiment of the present invention exemplarily illustrated in FIG. 1 is an apparatus which controls and generates a motor command current through a current control based on a driver's steering torque (also referred to as a "steering wheel torque") sensed and input by a torque sensor and a detected motor operation current (a current by which the motor is actually operated or a current actually output from the motor), to perform a function of assisting the driver's steering torque.

The above-mentioned motor command current is a current corresponding to an assist steering torque calculated based on an input driver's steering torque so as to assist the input driver's steering torque and is applied to the motor for the driving of the motor.

As illustrated in FIG. 1, the steering control apparatus 100 includes a main printed circuit board 100 in which the function of assisting a driver's steering torque is implemented with an electronic circuit and a motor operation current detection shunt resistor 120 directly mounted on a surface of the main printed circuit board 110 so as to detect a motor operation current.

The motor operation current detection shunt resistor 120 is a Surface Mount Device (SMD) directly mounted on the surface of the main printed circuit board 110 by using a surface mount technology.

Hereinafter, there will be described a technique of mounting a circuit device on a Printed Circuit Board (PCB) and an effect according to mounting of the motor operation current detection shunt resistor 120, serving as an SMD, on the main printed circuit board 110 by using the surface mount technology.

A technique of mounting a circuit device on a PCB includes a through-hole technology of inserting pins included in the circuit device into holes of a PCB and soldering a pad on an opposite side and a Surface Mount Technology (SMT) of directly mounting a circuit device on a surface of a PCB. A circuit device mounted on the PCB by using the through-hole technology is referred to as a through-hole device, and a circuit device mounted on the PCB by using the SMT is referred to as an SMD.

The through-hole technology has an advantage in that the PCB can be strongly coupled with the through-hole device and it is convenient to mount the circuit device on the PCB. However, the through-hole technology has a disadvantage in that a punching process for punching holes in the PCB is additionally required, thereby increasing the manufacturing costs, and an effective space for arranging signal lines on the PCB is limited to upper surfaces of multiple PCBs.

In comparison, the SMT is a technology capable of solving the disadvantages of the aforementioned through-hole technology and has advantages in that the mounting process is simple, manufacturing costs are relatively low, and an effective space for arranging signal lines on the PCB is not limited to upper surfaces of multiple PCBs. Further, the surface mount device mounted on the PCB by using the SMT has no pin or has shorter pins in comparison with a through-hole device so that it is smaller than that in the case of the same type of through-hole device.

As described above, by directly mounting the motor operation current detection shunt resistor 120, serving as the surface mount device, on the surface of the main printed circuit board 110 through the SMT, the manufacturing process can be simplified, the manufacturing costs are relatively low, and a size of the steering control apparatus 100 can be reduced.

In the meantime, as illustrated in FIG. 1, the steering control apparatus 100 according to the embodiment of the present invention may further include a current control transistor 130 for controlling a current and a heat dissipating printed circuit board 140 for dissipating heat, which is horizontally arranged on the same plane as the main printed circuit board 110 so as to dissipate heat from the current control transistor 130.

The heat dissipating printed circuit board 140 refers to a PCB including an insulation plate (insulation layer) made of a non-conductive metal, not phenolic resin and epoxy resin, in order to more easily transfer and dissipate heat when a high current is applied to the current control transistor 130.

Further, the current control transistor 130 may include at least one of a Field Effect Transistor (FET) and a bipolar transistor.

As described above, by arranging the heat dissipating printed circuit board 140 on the same surface to be horizontal to the main printed circuit board 110, there are effects that an additional member is not necessary so that the manufacturing process is simplified, the manufacturing costs are relatively low, and a size of the steering control apparatus 100 is reduced.

The aforementioned steering control apparatus 100 according to the embodiment of the present invention may be an Electronic Control Unit (ECU) for controlling a steering.

As described above, the present invention can provide the steering control apparatus 100 having a structure by which it is possible to efficiently dissipate high heat that may be generated, simplify the manufacturing process, and reduce the manufacturing costs.

Further, many and various apparatuses and sensors are mounted in a vehicle. However, a space of the vehicle is greatly limited so that the mounting of the apparatuses and sensors may greatly affect a design of the vehicle. Accordingly, by using the steering control apparatus 100 according to the embodiment of the present invention, it is possible to reduce a space for mounting the steering control apparatus 100, thereby effectively making better use of a space in designing a vehicle.

Even if it was described above that all of the components of an embodiment of the present invention are coupled as a single unit or coupled to be operated as a single unit, the present invention is not necessarily limited to such an embodiment. That is, among the components, one or more components may be selectively coupled to be operated as one or more units.

In addition, since terms, such as "including," "comprising," and "having" mean that one or more corresponding components may exist unless they are specifically described to the contrary, it shall be construed that one or more other components can be included. All of the terminologies containing one or more technical or scientific terminologies have the same meanings that persons skilled in the art understand ordinarily unless they are not defined otherwise. A term ordinarily used like that defined by a dictionary shall be construed that it has a meaning equal to that in the context of a related description, and shall not be construed in an ideal or excessively formal meaning unless it is clearly defined in the present specification.

Although a preferred embodiment of the present invention has been described for illustrative purposes, those skilled in the art will appreciate that various modifications, additions and substitutions are possible, without departing from the scope and spirit of the invention as disclosed in the accompanying claims. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A steering control apparatus, which controls and generates a motor command current through a current control based on an input driver's steering torque and a detected motor operation current, to perform a function of assisting the driver's steering torque, the steering control apparatus comprising:
    a main printed circuit board in which the function of assisting the driver's steering torque is implemented with an electronic circuit; and
    a motor operation current detection shunt resistor directly mounted on a surface of the main printed circuit board as a surface mount device (SMD) by using a surface mount technology so as to detect the motor operation current.

2. The steering control apparatus as claimed in claim 1, further comprising a current control transistor for controlling a current and a heat dissipating printed circuit board configured to dissipate heat from the current control transistor and horizontally arranged on a same plane as the main printed circuit board.

3. The steering control apparatus as claimed in claim 2, wherein the heat dissipating printed circuit board includes a metal printed circuit board.

4. The steering control apparatus as claimed in claim 2, wherein the current control transistor comprises at least one of a field effect transistor and a bipolar transistor.

* * * * *